US008866563B1

(12) United States Patent
Ben Artsi

(10) Patent No.: US 8,866,563 B1
(45) Date of Patent: Oct. 21, 2014

(54) CONNECTOR BASED COMPENSATION OF VIA STUB EFFECTS

(75) Inventor: Liav Ben Artsi, Nahariya (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 1197 days.

(21) Appl. No.: 12/725,119

(22) Filed: Mar. 16, 2010

Related U.S. Application Data

(63) Continuation-in-part of application No. 12/140,774, filed on Jun. 17, 2008, now Pat. No. 8,274,307.

(60) Provisional application No. 61/161,144, filed on Mar. 18, 2009.

(51) Int. Cl.
 *H03H 7/38* (2006.01)
(52) U.S. Cl.
 CPC ...................................... *H03H 7/38* (2013.01)
 USPC .............................................. 333/34; 333/246
(58) Field of Classification Search
 USPC ........................................ 333/32, 246, 34, 238
 See application file for complete search history.

(56) References Cited

U.S. PATENT DOCUMENTS

| 6,639,487 B1 | 10/2003 | Salmela et al. |
| 6,677,831 B1 | 1/2004 | Cheng et al. |
| 6,911,880 B2 | 6/2005 | Arai et al. |
| 6,980,063 B2 | 12/2005 | Mikalauskas |
| 7,145,411 B1 | 12/2006 | Blair et al. |
| 7,154,411 B2 | 12/2006 | Ciglenec et al. |
| 7,446,624 B2 | 11/2008 | Kashiwakura |
| 7,609,125 B2 | 10/2009 | Van Quach et al. |
| 7,671,450 B2 | 3/2010 | Nease et al. |
| 2006/0082378 A1 | 4/2006 | Majerus et al. |
| 2009/0152689 A1 | 6/2009 | Nease et al. |
| 2009/0284324 A1 | 11/2009 | Van Quach et al. |

OTHER PUBLICATIONS

U.S. Appl. No. 12/140,774, filed Jun. 17, 2008, Liav Ben Artsi.
Office Action issued in U.S. Appl. No. 12/140,774, dated Feb. 11, 2011.
Office Action issued in U.S. Appl. No. 12/140,774, mailed Aug. 30, 2010.

*Primary Examiner* — Stephen Jones

(57) ABSTRACT

Aspects of the disclosure provide a connector. The connector includes a first signal conductor. The first signal conductor is configured to receive a first electronic signal that includes multiple frequency components. The first signal conductor includes a plurality of conductor portions having portion-dependent impedances. The first signal conductor is configured to transfer the first electronic signal between a via on a circuit board that has a via stub and an electronic device to reduce via stub effects. In addition, in an example, the connector includes a second signal conductor to transfer a second electronic signal. The second electronic signal and the first electronic signal are a pair of differential signals. In an example, the first signal conductor and the second signal conductor have different via stub effects. The first signal conductor and the second signal conductor are configured with regard to each other to have portion-dependent differential impedances to mitigate the different via stub effects.

17 Claims, 6 Drawing Sheets

CONNECTOR BASED COMPENSATION OF VIA STUB EFFECTS

INCORPORATION BY REFERENCE

This application is a continuation-in-part application of U.S. Non-provisional application Ser. No. 12/140,774, "AN IMPEDANCE DISCONTINUITY COMPENSATOR FOR ELECTRONIC PACKAGES," filed by Liav Ben Artsi on Jun. 17, 2008, which is incorporated herein by reference in its entirety. Further, this application claims the benefit of U.S. Provisional Application No. 61/161,144, "A METHOD TO OVERCOME VIA STUB EFFECTS ON HIGH SPEED CONNECTORS," filed by Liav Ben Artsi on Mar. 18, 2009, which is incorporated herein by reference in its entirety.

BACKGROUND

A printed circuit board (PCB) is a thin board made from fiber glass, plastic or similar material that is "printed" with electrical wires, or traces. The traces on the PCB provide efficient electrical connections between leads of electronic components that are subsequently mounted to one or more surfaces of the PCB.

To support complex circuits with a PCB having a reduced two-dimensional footprint, several PCB layers can be vertically stacked and laminated together to form a multilayer PCB, in which circuit traces are present on each of the multiple layers of the multilayer PCB. In such multilayer PCBs, traces on the respective layers of the multilayer PCB are electrically connected using plated via connections.

A via is a hole, formed in at least one layer of a multilayered PCB, that interconnects one or more of the multiple layers of the multilayered PCB. A via typically passes through metal pads of traces on two or more layers of the multilayered circuit board. The hole is then plated with a metal conductor, e.g., copper, to form an electrical connection between the respective trace pads. When a plated hole extends beyond the PCB layer which has a trace that needs to be interconnected, a via stub is formed.

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

SUMMARY

A connector that is used to connect a circuit constructed on a multilayered PCB to another electronic device, e.g., another circuit constructed on another PCB, typically connects to either PCB using two main technologies. The first technology is surface mount technology (SMT), which mounts, by soldering, the connector pads on an outer layer of a PCB. The second technology uses through hole vias. In a soldering example, the connector pins are soldered inside the through hole vias. In a press-fit example, the connector pins are inserted into the through hole vias by applying pressure on the blade shaped connector pins. In the second technology, the through hole vias are a part of the connector footprint.

A via is a very simple and inexpensive approach for making a connection between traces on different layers of the multilayer PCB and a connector mounted to an outer plane surface of the multilayer PCB. However, if a trace connected to the connector is located on an interior layer of the PCB, a portion of the via between the trace and an outer surface of the multilayered PCB opposite side on which the connector is mounted becomes a residual stub. Such a via stub results in an added capacitance, or via stub effect, that reduces the bandwidth of signals that can be passed over signal conductor.

Accordingly, embodiments of a printed circuit board (PCB) connector are described that compensate for the effects of via stubs associated with a PCB connector foot print. In an example, a PCB connector foot print includes conductors that attach to interior traces of a multilayered PCB using one or more vias that extend beyond the intended trace, resulting in a via stub and a corresponding via stub effect on the performance of the connector. In another example, a PCB connect foot print includes a connector having a through hole connector pin that connects a surface trace, resulting in a via stub of the whole through hole connector pin, and a corresponding via stub effect on the performance of the connector. Further, methods of designing signal conductors used within a printed circuit board connector that compensate for the effects of via stubs are described.

Each signal conductor within the printed circuit board connector includes at least three sections connected in series. The impedance of a middle section of the signal conductor is reduced in comparison to the impedance of the outer sections of the signal conductor, resulting in an impedance matched signal conductor that compensates for excess capacitance introduced by via stubs at one or more of the respective ends of the signal conductor. In this manner, the frequency response characteristics of a low-pass filter formed by the signal conductor and the respective via stub capacitances is extended, thereby allowing the connector to support bandwidths with higher frequency signal components.

The described PCB connector and method of designing connector signal conductors allow PCB designers to reduce the effects of stub capacitance without increasing per board manufacturing costs or placing limitation on the PCB layers on which pads to be connected by vias are located.

Aspects of the disclosure can provide a connector. The connector includes a first signal conductor. The first signal conductor is configured to receive a first electronic signal that includes multiple frequency components. The first signal conductor includes a plurality of conductor portions having portion-dependent impedances. The first signal conductor is configured to transfer the first electronic signal between a via on a circuit board that has a via stub and an electronic device to reduce via stub effects.

Further, the connector includes a second signal conductor configured to transfer a second electronic signal. The first electronic signal and the second electronic signal are a pair of differential signals. In addition, the first signal conductor and the second signal conductor can be configured with regard to each other to be suitable for transmitting the pair of differential signals. In an example, the first signal conductor and the second signal conductor can be configured to reduce mismatches due to different via stub effects. For example, the first signal conductor and the second signal conductor have portion-dependent differential impedances to mitigate the different via stub effects.

In an embodiment, the first signal conductor includes a first longitudinal portion that has a first impedance, a second longitudinal portion that has a second impedance that is different than the first impedance, and a third longitudinal portion that has a third impedance that is different than the second impedance. Further, in an example, the third longitudinal portion of the first signal conductor is configured to have the same impedance as the first longitudinal portion. In addition, in an example, the second longitudinal portion of the first signal conductor is configured to have a smaller impedance than the first and second longitudinal portions.

In an example, a cross-sectional area of the second longitudinal portion is greater than a cross-sectional area of the first longitudinal portion and is greater than a cross-sectional area of the third longitudinal portion. In another example, a distance between the first signal conductor and the second signal conductor varies for different portions.

According to an aspect of the disclosure, the first signal conductor includes a ground return. The ground return is electromagnetically coupled to the first longitudinal portion, the second longitudinal portion, and the third longitudinal portion.

From another aspect, the connector includes at least one of a male portion and a female portion.

Aspects of the disclosure provide a method for reducing signal loss. The method includes receiving from a via on a circuit board a first electronic signal that includes multiple frequency components. The via includes a via stub that causes an interference to transference of the first electronic signal to an electronic device. The method further includes transferring the first electronic signal to the electronic device through a first signal conductor that includes a plurality of portions. The plurality of portions are configured to have portion-dependent impedances that reduce the interference.

Further, the method includes transferring a second electronic signal to the electronic device through a second signal conductor. The first electronic signal and the second electronic signal are a pair of differential signals. In addition, the first signal conductor and the second signal conductor can be configured with regard to each other for suitably transmitting the pair of differential signals. In an example, the first signal conductor and the second signal conductor can be configured to reduce mismatches due to different via stub effects. For example, the first signal conductor and the second signal conductor have portion-dependent differential impedances to mitigate the different via stub effects.

To transfer the first electronic signal to the electronic device through the first signal conductor, the method includes transferring the first electronic signal to the electronic device through the first signal conductor having the plurality of portions configured to mitigate capacitive discontinuity of the via stub.

In an embodiment, the method includes passing the first electronic signal through a first longitudinal portion of the first signal conductor that has a first impedance, passing the first electronic signal through a second longitudinal portion that has a second impedance that is different than the first impedance, and passing the first electronic signal through a third longitudinal portion that has a third impedance that is different than the second impedance.

In an example, the third impedance is the same as the first impedance. In addition, the second impedance is less than the first impedance and the third impedance. In an example, a cross-sectional area of the second longitudinal portion is greater than a cross-sectional area of the first longitudinal portion and is greater than a cross-sectional area of the third longitudinal portion. In another example, a distance between the first signal conductor and the second signal conductor varies for different portions.

According to an aspect of the disclosure, the first longitudinal portion, the second longitudinal portion, and the third longitudinal portion of the first signal conductor are electromagnetically coupled to a ground return.

In an embodiment, the method includes passing through the first electronic signal through at least one of a male portion and a female portion.

According to an embodiment of the disclosure, a connector includes a proximal signal conductor segment, a distal signal conductor segment, and an intermediate signal conductor segment. The proximal signal conductor segment is configured to receive a broadband signal from a signal generator having a signal generator impedance. The distal signal conductor segment is configured to conduct the broadband signal to a load having a load impedance. The intermediate signal conductor segment is coupled between the proximal and distal signal conductor segments. The intermediate signal conductor segment is configured differently than the proximal signal conductor segment and the distal signal conductor segment to reduce interferences and/or capacity discontinuity caused by via stub effects, and thus to improve a performance function of the broadband signal from the signal generator to the load over a predefined frequency band of the broadband signal. The broadband signal includes a plurality of frequency components. The generator is located on a first electronic device, such as a first printed circuit board and the load is located on a second electronic device, such as second printed circuit board. The connector is pre-designed to mitigate via stub effects introduced from the first printed circuit board and/or the second printed circuit board.

BRIEF DESCRIPTION OF THE DRAWINGS

Embodiments of a printed circuit board connector that compensates for via stub effects and a method of designing signal conductors used within the printed circuit board connector will be described with reference to the following drawings, wherein like numerals designate like elements, and wherein.

DETAILED DESCRIPTION OF EMBODIMENTS

Figure 1:
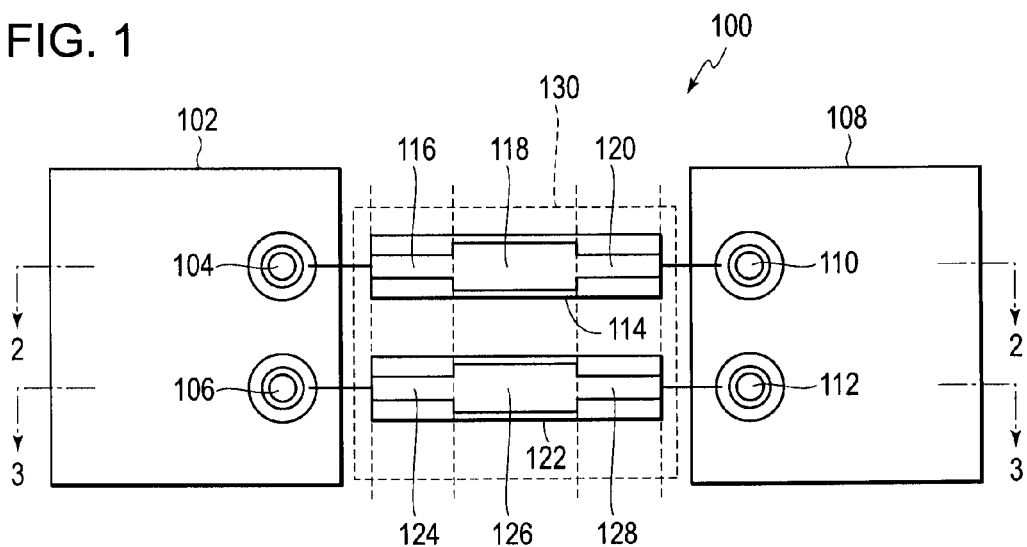
FIG. 1 is a top plan view of two multilayer circuit boards connected by a connector that compensates for via stub effects in accordance with an embodiment of the disclosure.

FIG. 1 is a top plan view of two multilayer circuit boards connected by a connector that compensates for via stub effects in accordance with an embodiment of the disclosure. Although two multilayer circuit boards are seen in FIG. 1 for purposes of simplicity and maintaining clarity in presenting teaching principles of disclosure, it is noted that inasmuch as one of the circuit boards suffers from via stub effects, the other circuit board can be any suitable electronic device. As seen in FIG. 1, a first multilayered printed circuit board (PCB) 102 is mechanically and electrically connected to a second multilayered PCB 108 by a PCB connector 130. As further seen in FIG. 1, a first signal conductor 114 of PCB connector 130 connects a first via 104 of first multilayered PCB 102 to a first via 110 of second multilayered PCB 108, and a second signal conductor 122 of PCB connector 130 connects a second via 106 of first multilayered PCB 102 to a second via 112 of second multilayered PCB 108.

PCB connector 130 is shown in FIG. 1 by a schematic representation in which the physical package of PCB connector 130 is represented by a dashed broken line, and each signal conductor in PCB connector 130 is represented by a schematic representation that includes three contiguous segments. For example, first signal conductor 114 is shown to include segment 116, segment 118 and segment 120. Second signal conductor 122 is shown to include segment 124, segment 126 and segment 128. Embodiments of first signal conductor 114 and second signal conductor 122 are described in detail with respect to FIG. 4 and FIG. 5, below.

A signal conductor within a PCB connector 130 may be attached to a via on a PCB using any type of suitable connection. For example, an end of a signal conductor within PCB connector 130 can be soldered to a PCB via, secured using a pressure-fit connection inserted within the via, and/or mechanically and electrically connected in any manner that results in a strong electrical connection between the via and the signal conductor. A signal connector attached in such a manner on the PCB side of the connector may terminate, at an opposite end within the connector, with any mechanical design, e.g., a female configuration, a male configuration, etc., that allows the connector to form a strong electrical connection between each signal connector within the connector and the signal connectors in a corresponding connector on another electronic device.

Although the embodiment of PCB connector 130 shown in FIG. 1 includes only two signal conductors, other PCB connector embodiments can include any number of signal conductors. In embodiments, signal conductors are configured on an outer surface of PCB connector 130 in a manner that facilitates mechanical and electrical attachment to a via using any type of signal conductor attachment technique, as described above. For example, signal conductors on the PCB side of PCB connector 130 may be configured to be soldered to a pad connected to the end of a via, or may be configured with mechanically gripping pressure-fit ends that insert into and physically engage an interior surface of a via, thereby forming a reliable electrical connection between the signal connector and the via.

In embodiments of PCB connector 130, the signal conductors can be constructed in any manner using any suitable type of conductive material and in various suitable geometrical constructions. However, the impedances associated with the respective signal conductor segments should comply with the impedance requirements determined as described with respect to FIG. 6 and FIG. 7, below. Further, the impedance of signal conductor as a whole and the total lengths of the respective conductors should comply with a target impedance provided, for example, in a top-level specification for the connector.

By suitably configuring the impedances of the signal conductors, via stub effects can be suitably compensated. Thus, cost-effective soldering technology, such as the surface mount technology, the through hole via technology, and the like, can be used to mount traces to connector pads on the PCB board.

In another example to reduce via stub effects, via stubs are eliminated by, for example, blind via technology, counter-drilling plating removal technology, and the like. In a blind via technology, a blind via can be created by using a laser to burn a via hole from a top surface of a multilayer PCB down to a target trace pad located at a lower layer of a multilayer PCB. Since the laser does not penetrate the target trace pad, a via can be formed that does not include a stub below the target trace pad. In a counter-drilling plating removal technology, the plating of a via stub can be removed by counter-drilling the via from a direction opposite the portion of the via intended for use. However, these example approaches for eliminating the via stub effects are not as cost efficient as the through hole via technology because the approaches require the introduction of additional steps and/or additional complexities during the PCB manufacturing process, and thereby increase per board manufacturing costs.

In another example to reduce via stub effects, circuit designers can design multilayer PCB layouts in which all vias used to connect traces are located on the outer layers of the multilayered PCB, thereby eliminating potential via stubs. However, this example approach for eliminating via stubs limits the flexibility of PCB designers to optimally place trace pads within the multiple layers of the multilayered PCB, resulting in a PCB that does not make efficient use of the respective layers of a multilayered PCB and, therefore, has a larger footprint and/or is more expensive to produce than otherwise could have been achieved.

Figure 2:
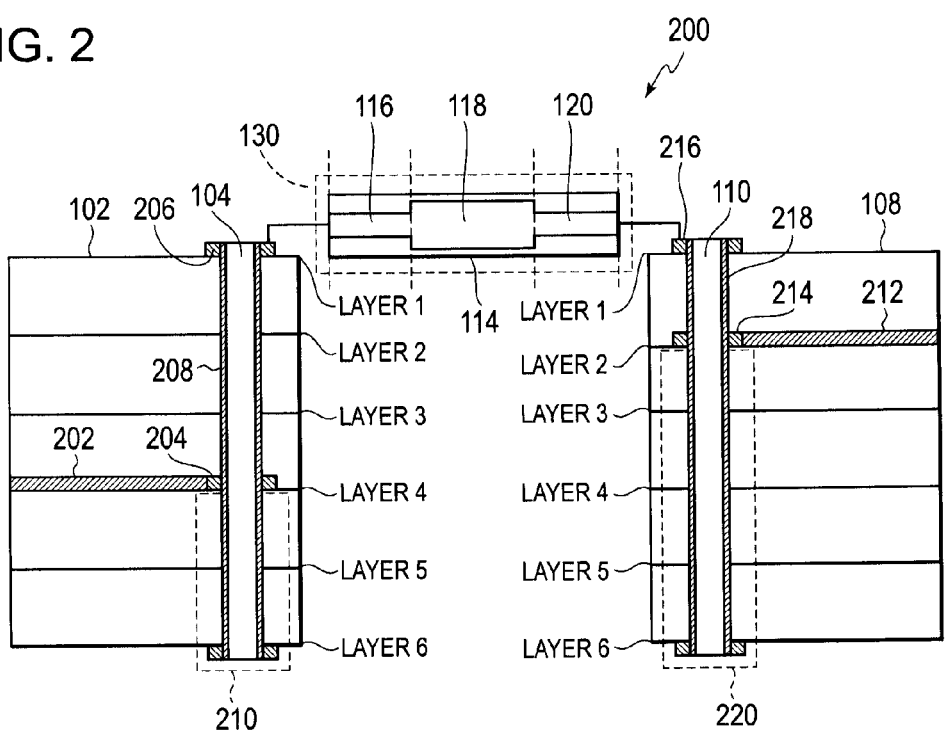
FIG. 2 is a first cross-sectional view of the multilayer circuit boards and connector of FIG. 1.

FIG. 2 is a first cross-sectional view, through line "2," of the multilayer circuit boards and connector described above with respect to FIG. 1. As seen in FIG. 2, in an embodiment via 104 is formed by drilling a hole, e.g. by mechanical drilling, laser drilling or any other suitable drilling process, through all layers of multilayer PCB 102. In FIG. 2, the hole intersects a pad 206 located at layer 1 of multilayer PCB 102 and further intersects pad 204 of trace 202 located at layer 4 of multilayer PCB 102. A conductive plating of the drilled hole at 208 forms an electrical connection between the respective pads 204 and 206. Such a through via is a very simple and inexpensive approach for making connections between traces on different layers of the multilayer PCB; however, such an approach for connecting pad 206 with pad 204 results in the creation of a via stub 210, between layer 4 and layer 6 of the multilayered PCB. Such a via stub results in an added capacitance, or stub effect, that, together with the connector conductor and any discontinuity on the opposite side of the connector, reduces the bandwidth of signals that can be passed over signal conductor 114. Stubs that have excessive capacitance can also be created by pressure-fit ends that insert into and physically engage an interior surface of a via, if the ends of the pressure-fit connectors protrude past the trace with which the connection is formed and/or protrude past an opposite outer layer surface of the PCB. Stubs can also be formed by soldered connector that has a connector pin that protrudes past the trace with which the connection is formed and/or protrudes past an opposite outer layer surface of the PCB.

As further seen in FIG. 2, in an embodiment, via 110 is formed by drilling a hole through all layers of multilayer PCB 108, the hole intersecting a pad 216 located at layer 1 of multilayer PCB 108 and intersecting pad 214 of trace 212 located at layer 2 of multilayer PCB 108. A conductive plating of the drilled hole at 218 forms an electrical connection between the respective pads. Such a through via is a very simple and inexpensive approach for making connections between traces on different layers of the multi-layer PCB; however, such an approach for connecting pad 216 with pad 214 results in the creation of a via stub 220, between layer 2 and layer 6 of the multilayered PCB. As described in greater detail below, such a via stub results in an added capacitance and together with the connector conductor and any other discontinuity located on the other side of the connector reduces the bandwidth of signals that can be passed over signal conductor 114.

Figure 3:
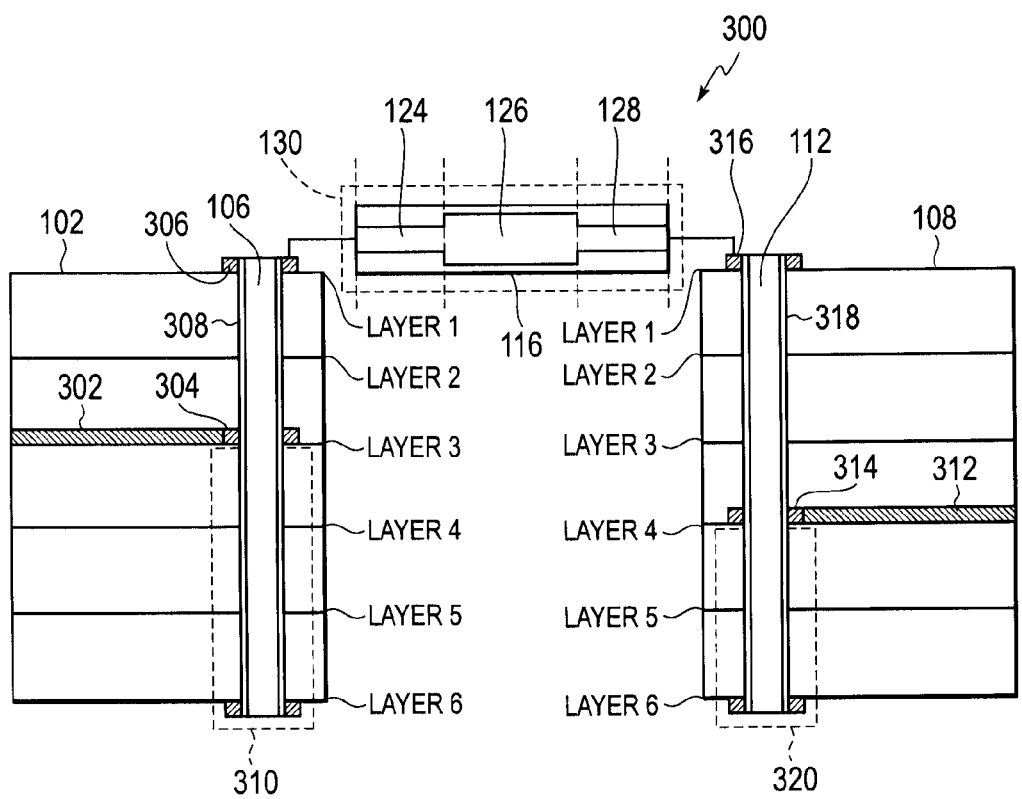
FIG. 3 is a second cross-sectional view of the multilayer circuit boards and connector of FIG. 1.

FIG. 3 is a second cross-sectional view, through line "3", of the multilayer circuit boards and connector described above with respect to FIG. 1. As seen in FIG. 3, in an embodiment, via 106 is formed by drilling a hole, e.g. by mechanical drilling, laser drilling or any other suitable drilling process, through all layers of multilayer PCB 102. In FIG. 3, the hole intersects a pad 306 located at layer 1 of multilayer PCB 102 and further intersects pad 304 of trace 302 located at layer 3 of multilayer PCB 102. A conductive plating of the drilled hole at 308 forms an electrical connection between the respective pads 304 and 306. Such a through via is a very simple and inexpensive approach for making connections between traces on different layers of the multilayer PCB; however, such an approach for connecting pad 306 with pad 304 results in the creation of a via stub 310, between layer 3 and layer 6 of the multilayered PCB. As described in greater detail below, such a via stub results in an added capacitance, or stub effect, that, together with the connector conductor, reduces the bandwidth of signals that can be passed over signal conductor 116.

As further seen in FIG. 3, via 112 is formed, for example, by drilling a hole through all layers of multilayer PCB 108, the hole intersecting a pad 316 located at layer 1 of multilayer PCB 108 and intersecting pad 314 of trace 312 located at layer 4 of multilayer PCB 108. A conductive plating of the drilled hole at 318 forms an electrical connection between the respective pads 314 and 316. Such a through via is a very simple and inexpensive approach for making connections between traces on different layers of the multilayer PCB; however, such an approach for connecting pad 316 with pad 314 results in the creation of a via stub 320, between layer 4 and layer 6 of the multilayered PCB. As described in greater detail below, such a via stub results in an added capacitance that reduces the bandwidth of signals that can be passed over signal conductor 116.

It is noted that the length of a via stub is determined by various factors, such as the location of the trace pads connected by the via, the cross-section of the printed circuit board, and the like. As shown in FIG. 2 and FIG. 3, the length of via stubs on either side of a signal conductor, the relative difference between via stub lengths on either side of a signal conductor, and the via stub lengths and relative via stub length differences associated with signal conductors associated with a signal conductor pair, or transmission pair, can all vary depending on the location of pads within the respective multilayer PCBs that are connected by the respective vias.

It is noted that a PCB connector can be implemented in any suitable manner. In one example PCB connector embodiment, the PCB connector is configured as a flexible ribbon connector containing one or more signal conductors. In another example embodiment connectors are configured to include a first section, e.g., a female section, that connects to the circuit on the PCB, that mates with a corresponding second section, e.g., a male section, that is electrically connected to the electronic device, e.g., another circuit on another PCB. Both connector sections are usually made of conducting material embodied inside some kind of non conductive material that hold the whole structure together and enables connecting and disconnecting the two sections of the connector.

It is noted that, in an embodiment, PCBs connected by a PCB connector are positioned relative to one another in any manner as determined by a required footprint or form factor required by the device in which the PCBs are to be included. For example the respective PCBs may be placed side-by-side, end-to-end, vertically stacked, or stacked in an offset or staggered manner. Embodiments of the described PCB connector can be physically configured in any suitable manner to meet the requirements of any such PCBs to be connected, while providing segmented, impedance matched signal conductors that overcome the electrical effects of via stubs, as described in greater detail below with respect to FIG. 4 and FIG. 5.

Figure 4:
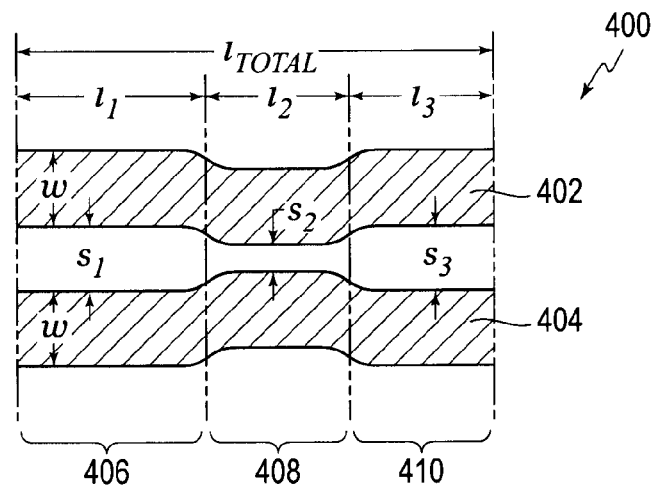
FIG. 4 shows an example of a first signal conductor pair.

FIG. 4 shows an embodiment of a first signal conductor pair, or transmission pair, 400 that includes a first signal conductor 402 and a second signal conductor 404. Although not shown in FIG. 4, signal conductor pair 400 can also include a common ground plane conductor, or reference conductor, that is located aside to the respective signal conductors and separated from the respective signal conductors by any form of nonconductive material such as plastic, air, and the like. First signal conductor pair 400, i.e., the pair of traces, includes a proximal segment 406, a middle segment 408, and a distal segment 410. In one such embodiment, first signal conductor pair 400 can be, for example, a differential pair of traces that are described in terms of a characteristic impedance or a differential impedance.

As shown in FIG. 4, each of proximal segment 406, middle segment 408, and distal segment 410 includes a pair of traces. It is noted that the transmission pair can also include a return path (not shown). As further shown in FIG. 4, each trace in a segment has a length ($l_1$, $l_2$, $l_3$), a width ($w_1$, $w_2$, $w_3$) and a spacing ($s_1$, $s_2$, $s_3$) that separates the trace from the other trace of first signal conductor pair 400. For example, a spacing, $s_1$, between signal conductor 402 and signal conductor 404 in segment 406 is equal to a spacing, $s_3$, between signal conductor 402 and signal conductor 404 in segment 410. A spacing, $s_2$, between signal conductor 402 and signal conductor 404 in segment 408 is decreased, for example by bending the metals and bringing them closer together during connector manufacturing, so that the characteristic impedance of segment 408 is reduced, e.g., to 60 Ω, relative to the impedance of a differential trace pair, e.g., 100 Ω, in which the spacing $s_2$ between signal conductor 402 and signal conductor 404 in segment 408 is equal to the spacing $s_1$ and the spacing $s_3$, as in segment 406 and segment 410.

The length of the conductors within the connector is usually a restriction of the connector structure. It is noted that both the impedance and length of proximal segment 406, middle segment 408, and distal segment 410 can be adjusted to decrease an insertion loss. For example, both the impedance and length of proximal segment 406, middle segment 408, and distal segment 410 can be adjusted to increase an insertion loss frequency behavior of the low-pass filter formed by the impedance of the respective signal conductors and the capacitance created by one or more via stubs located on either end of the respective signal conductors.

In embodiments, the total length of proximal segment 406, middle segment 408, and distal segment 410 are constrained to equal a pre-determined connector trace length. For example, in an embodiment the total length of proximal segment 406, middle segment 408, and distal segment 410 are constrained to equal a prescribed distance that is equal to a trace length that can be implemented within the PCB connector. Other constraints, such as minimum or maximum trace widths and spacings, material properties, and the like, may be established a priori by manufacturability requirements, production cost considerations, and the like. The constraints may be included in a performance optimization methods that adjusts the characteristics of the connector conductors as described further with respect to FIG. 6 and FIG. 7.

Figure 5:
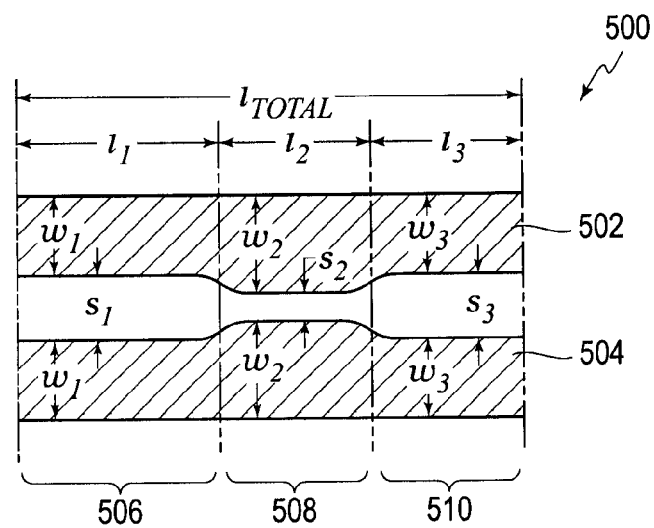
FIG. 5 shows an example of a second signal conductor pair.

FIG. 5 shows an embodiment of a second signal conductor pair, or transmission pair, 500 that includes a first signal conductor 502 and a second signal conductor 504. In the embodiment, the respective signal conductors are implemented as metals within a connector. Although not seen in FIG. 5, in accordance with an embodiment, signal conductor pair 500 includes a common ground plane conductor, or reference conductor, that is located along side the respective signal conductors and separated from the respective signal conductors by any suitable non conductive material. In the embodiment seen in FIG. 5, second signal conductor pair 500, i.e., the pair of traces, includes a proximal segment 506, a middle segment 508, and a distal segment 510. The corresponding features and functions of elements of FIG. 5 may be understood in light of FIG. 4. The impedance of the signal conductor 500 can be modified due to alterations in a spacing and a width of conductors or traces in a middle segment 508. For example, reducing the spacing between the pair of conductors in segment 508 decreases a differential impedance of the pair from, for example, approximately 100 Ω to, for example, approximately 60 Ω. It is noted that 100 Ω may be the target differential impedance in an embodiment of signal conductor pair 500 in which the conductor pair provides a signal to/from a serializer-deserializer (SERDES) on a first PCB to/from a circuit on a second PCB via an embodiment of the described PCB connector that corrects for the effects of via stub capacitances on either side of the respective signal conductors of signal conductor pair 500.

It is noted that the embodiments of signal conductor pairs described above with respect to FIG. 4 and FIG. 5 are exemplary only. As described with respect to FIG. 7, below, the impedance on a middle segment of a signal conductor can be reduced relative to the impedance of outer signal conductor segments in any number of ways, including but not limited to, increasing one or more cross-section dimensions of a middle segment of a signal conductor, reducing a distance between a middle segment of a signal conductor and a ground plane, reducing the distance between a middle segment of a signal conductor and its corresponding neighbor that forms with it the differential pair, etc., relative to the outer signal conductor segments.

In an embodiment, the signal conductor pairs described with respect to FIG. 4 and FIG. 5 are configured to transfer a pair of differential signals. In an example, the first signal conductor 502 is configured to transfer a positive signal of the pair of differential signals, and the second signal conductor 504 is configured to transfer a negative signal of the pair of differential signals. According to an embodiment of the disclosure, segments of the first signal conductor 502 are suitably configured to compensate for interferences and/or capacitive discontinuities due to the via stub effects for transferring the positive signal. Similarly, segments of the second signal conductor 504 are suitably configured to compensate for interferences and/or capacity discontinuities due to the via stub effects from transferring the negative signal. Thus, the first signal conductor 502 and the second signal conductor 504 are configured to transfer the pair of differential signals to reduce mismatches caused by the via stub effects.

In an embodiment, the first signal conductor 502 and the second signal conductor 504 are individually configured to reduce via stub effects. For example, the first signal conductor 502 is configured to reduce via stub effects introduced by vias from one or both sides of the first signal conductor 502. The second signal conductor 504 is configured to reduce via stub effects introduced by vias from one or both sides of the second signal conductor 504.

In another embodiment, the first conductor 502 and the second signal conductor 504 are configured with regard to each other to reduce mismatches, such as different via stub effects introduced from one or both sides of the first signal conductor 502 and the second signal conductor 504, and the like, that can affect differential signal transmission. In an example, the first signal conductor 502 and the second signal conductor 504 are configured with regard to each other to have portion-dependent differential impedances in order to mitigate the different via stub effects from one or both sides of the first signal conductor 502 and the second signal conductor 504. Thus, the first signal conductor 502 and the second signal conductor 504 along with the vias are suitable for transmitting the pair of differential signals.

It is noted that although the example signal conductor pairs described above with respect to FIG. 4 and FIG. 5 have all been divided into three segments, the described approach is not limited to dividing a signal conductor into only 3 segments. As described in greater detail below with respect to FIG. 6 and FIG. 7, a number of segments into which a signal conductor is divided can vary.

Figure 6:
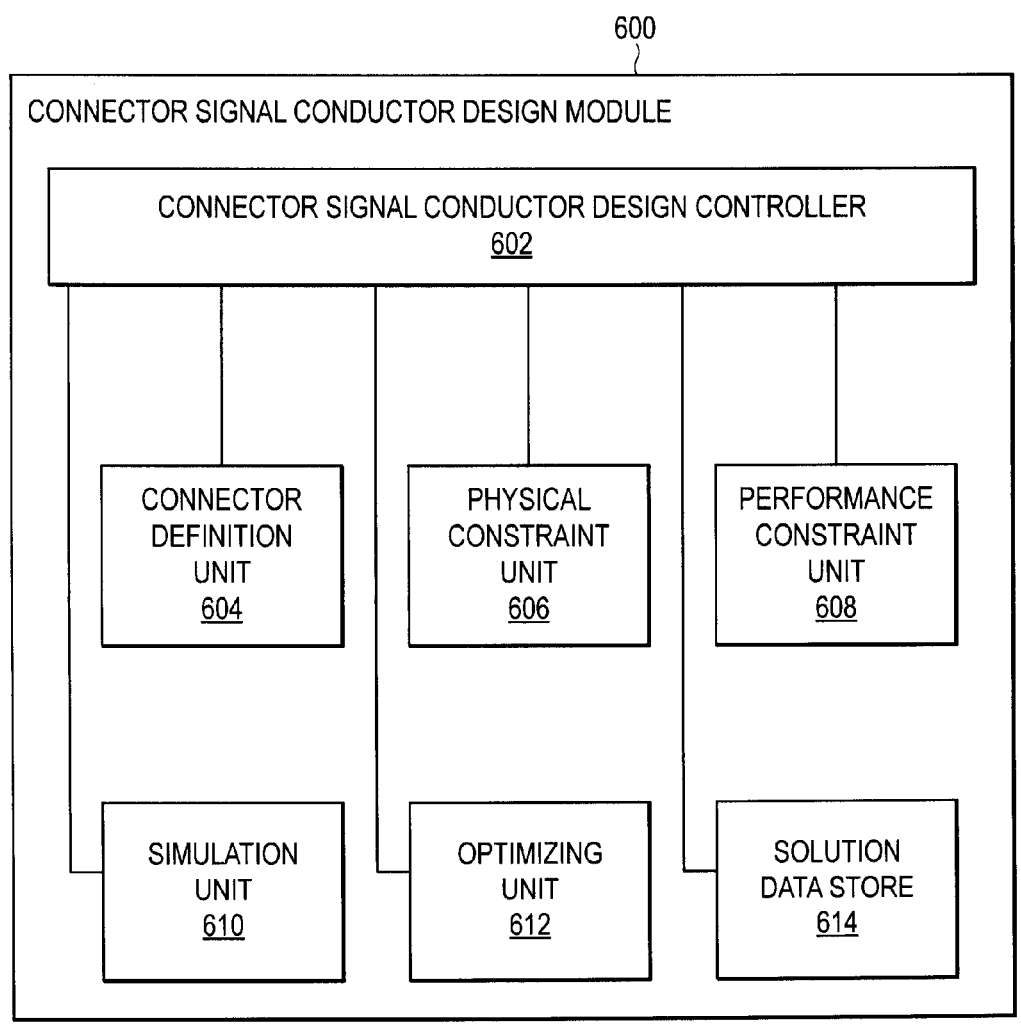
FIG. 6 is a block diagram of a connector signal conductor design module in accordance with an embodiment of the disclosure.

FIG. 6 is a block diagram of a connector signal conductor design module in accordance with an embodiment of the disclosure. Connector signal conductor design module 600 is used to determine an optimal number of segments into which a signal conductor within a PCB connector should be divided and to determine a signal impedance that should be assigned to each of the respective signal conductor segments. Connector signal conductor design module 600 allows an impedance matched conductor to be designed that complies the a top-level specification for the conductor and that mitigates the effects of one or more via stubs associated with the signal conductor when the PCB connector attaches to a PCB board at one or more vias.

As seen in FIG. 6, an embodiment of connector signal conductor design module 600 includes a connector signal conductor design controller 602, a connector definition unit 604, a physical constraint unit 606, a performance constraint unit 608, a simulation unit 610, an optimizing unit 612, and a solution data store 614. Embodiments of connector signal conductor design module 600 may be implemented as part of a PCB connector design tool implemented, for example, as part of an overall electronic circuit and PCB layout/design tool implemented in software and executed, for example, on a workstation computer.

In accordance with an embodiment, connector signal conductor design controller 602, maintains a set of static and/or dynamically updated control parameters that are used to invoke the other modules included in connector signal conductor design module 600 to perform process flows that determine impedance levels for segments of signal conductors included in a connector, as described below with respect to FIG. 7. For example, in one embodiment, connector signal conductor design controller 602 communicates with and receives status updates from the respective modules within connector signal conductor design module 600 to control operation of the respective instances of the process flow described below with respect to FIG. 7 for each conductor included in a PCB connector.

In accordance with an embodiment, connector definition unit 604 includes a user interface that allows a PCB connector to be described, e.g., in terms of the number of signal conductors included in the PCB connector. Further, connector definition unit 604 collects and stores information, e.g., length, diameter, plating material, etc., related to each via stub that will be associated with each end of a conductor in the PCB connector when the PCB connector is connected between two PCBs.

In accordance with an embodiment, physical constraint unit 606 includes a user interface that allows physical constraints associated with the PCB connector to be defined. Such constraints may include, but are not limited to a target length for each of the signal conductors included in the PCB connector, a target impedance for each of the signal conductors included in the PCB connector, a maximum width and/or height of a cross section of signal conductors included in the PCB connector, etc. Such information is used to place constraints on the optimized features assigned to the respective segments of an impedance matched conductor that compensates for the effects of via stubs. If connector signal conductor design module 600 is part of a circuit layout/PCB design suite, embodiments of physical constraint unit 606 may receive such information in an automated manner from other modules within the circuit layout/PCB design suite.

In accordance with an embodiment, performance constraint unit 608 includes a user interface that allows performance constraints associated with the PCB connector to be defined. For example, such performance constraints may include, but are not limited to a maximum insertion loss, e.g., in decibels, that is acceptable for an identified band of frequencies, and/or a maximum return loss, e.g., in decibels, that is acceptable for an identified band of frequencies.

In accordance with an embodiment, simulation unit 610 provides, for example, a 3-D field solver that allows, for example, insertion losses and return losses to be calculated for a signal conductor based on a set of parameters, or parameter vector, assigned to a conductor. For example, embodiments of a conductor parameter vector may include a total length of the signal conductor, a target impedance requirement for the signal conductor, a number of conductor segments into which the signal conductor is divided, a length of each conductor segment, an impedance assigned to each conductor segment, a width/height of a cross section of each conductor segment, a length of via stubs associated with the respective ends of the signal conductor. In addition, embodiments of a conductor parameter vector may include a spacing between the pair of conductors in a conductor segment, and/or a width of a dielectric segment that separates a conductor segment from a near or far ground plane. In embodiments, simulation unit 610 is iteratively invoked to generate, for example, insertion losses and return losses for a conductor using incremental variants of an initial set of conductor segment parameters. During such iterative processing, the values assigned to the respective conductor segments are constrained by physical constraints retrieved from physical constraint unit 606 and/or performance constraints retrieved from performance constraint unit 608. Such iterative processing is performed until a set of acceptable performance results are generated.

In accordance with an embodiment, optimizing unit 612 controls the iterative execution of simulation unit 610 to identify one or more sets of signal conductor parameter vector value configurations for a signal conductor that result in acceptable performance results. In one embodiment, optimizing unit 612 incrementally changes individual signal conductor vector parameter values assigned to the respective segments of a signal conductor based on an analysis of previously generated simulation values, e.g., a simulated insertion loss and/or simulated return loss, calculated by simulation unit 610 for a frequency range based on a previous set of vector parameters assigned to each segment of the signal conductor. Vector parameters that result in an acceptable frequency response, i.e., a frequency response that meets all performance constraints identified by performance constraint unit 608, are stored in solution data store 614.

In an embodiment, the optimizing unit 612 adjusts geometrical characteristics of the conductors in order to optimize the conductor signal transferring performance. In an example, the optimizing unit 612 adjusts a design of cross-section dimensions of different segments of a conductor. In another example, the optimizing unit 612 adjusts a distance between segments of a conductor to a ground plane. In another example, the optimizing unit 612 adjusts a distance between segments of a conductor to a neighboring conductor. The conductor and the neighboring conductor form a conductor pair for transferring a pair of differential signals.

In accordance with an embodiment, solution data store 614 provides a repository for sets of signal conductor vector parameters that result in acceptable performance results. In embodiments, once acceptable solutions for a PCB connector signal conductor are generated and stored, as described above, a best solution is selected from among the sets of vector parameters stored in solution data store 614.

Figure 7:
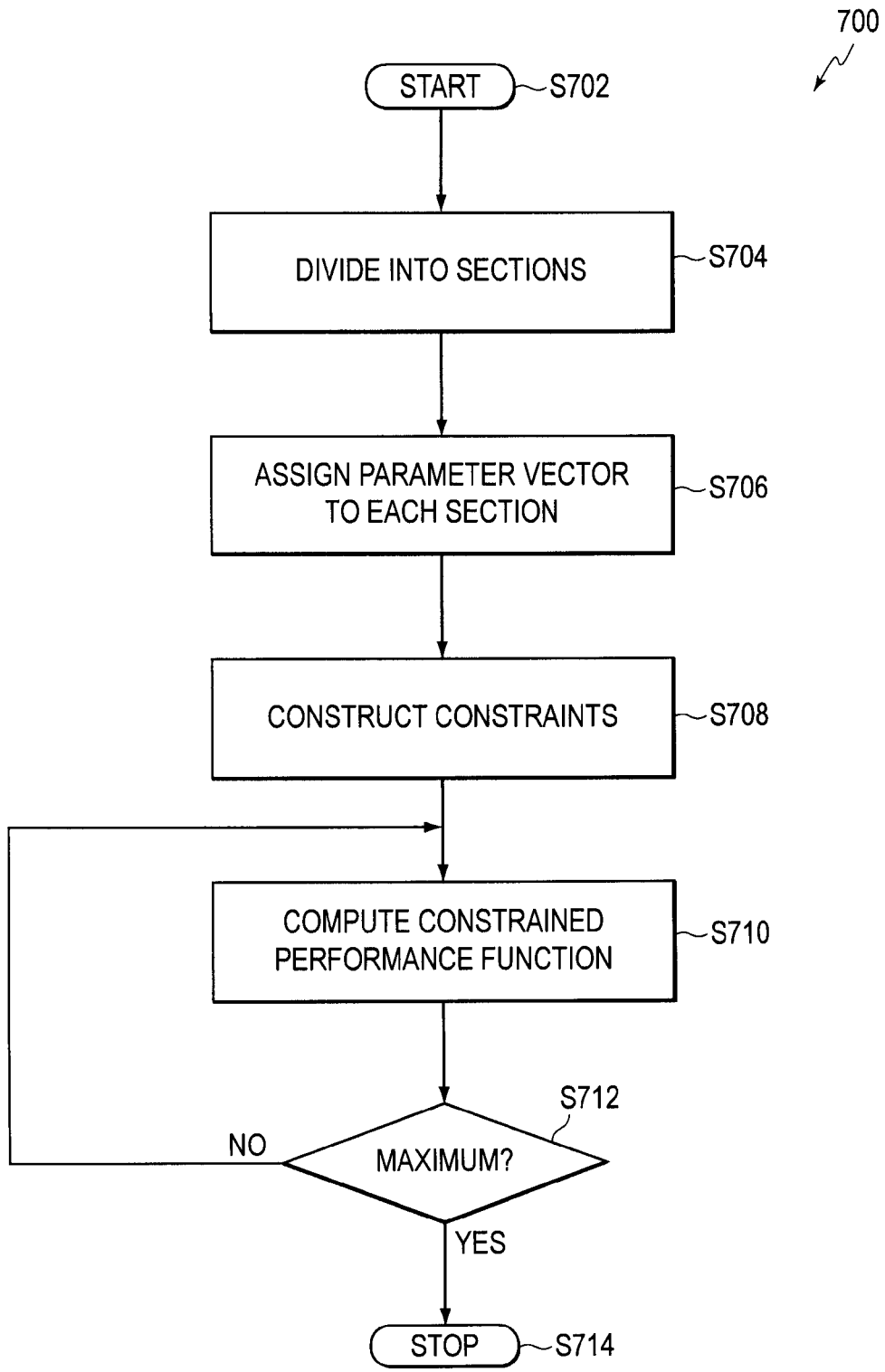
FIG. 7 is a flow-chart of a process flow that is performed by the connector signal conductor design module of FIG. 6, to determine an optimized signal conductor.

FIG. 7 is a flow-chart of an example process flow that is performed, for example, by the connector signal conductor design module of FIG. 6, to determine a set of parameter vectors for segments of a signal conductor included in a PCB connector. The optimized signal conductor can transport a signal from a first PCB to an electronic device, e.g., another PCB, via the PCB connector with as minimal as required distortion of amplitude characteristics, distortion of phase characteristics, or incurring significant signal reflection from the first PCB to the second PCB or vice versa, despite the presence of via stubs on one or more sides of the signal conductor. In other words, the optimized PCB connector signal conductor can transport a signal between the first PCB and the second PCB while maintaining an essentially linear phase characteristic over a desired frequency range, while negating the effects of via stubs on one or more sides of the signal conductor. The optimized signal conductor can maximize a constrained performance function or signal fidelity function such as: a real power transfer coefficient between the respective PCBs, a transmission coefficient, a reflection loss, a Q statistic, an insertion loss, an integral of the insertion loss over a predetermined frequency, a knee frequency, and the like. As seen in FIG. 7, operation of process 700 begins at S702 and proceeds to S704.

At S704, connector signal conductor design controller 602 selects a first/next signal conductor of a predefined or a constrained length and divides the signal conductor into a selected number of segments. For example, the signal conductor may be divided into a proximal segment, a middle or central segment, and a distal segment. Dividing the signal conductor into segments does not necessarily mean that the length of each segment is predetermined. In other words, the number of segments may be determined but the length of each segment may be regarded as a parameter for a subsequent performance-optimizing calculation. The total number of segments may also be regarded as a parameter for optimization. Further, the effects of male and female connector terminations can be optimized by taking into account, e.g., using 3D extraction, the discontinuities that may occur at the respective male and the female terminated ends of the connector. Once the selected signal conductor is divided into segments, operation of the process continues at S706.

At S706, connector signal conductor design controller 602 assigns a first/next set of parameter vector values to each of the respective signal conductor segments. An assigned parameter vector can include, for example, a length of each segment, trace widths, trace spacings, permittivities, conductivities, characteristic impedances, differential impedances, and the like. For example, parameter vector values for a first segment can include the segment length and parameter vector values for a second or middle segment can include a trace spacing and a segment length. Once parameter vector values are assigned to the respective signal conductor segments, operation of the process continues at S708.

At S708, connector signal conductor design controller 602 constructs one or more simulation physical and/or performance constraints, or iteration processing constraints, based on one or more connector definitions retrieved from connector definition unit 604, one or more physical constraints retrieved from physical constraint unit 606, and/or one or more performance constraints retrieved from performance constraint unit 608. For example, the sum of the lengths of each segment can be restricted to equal the total length of the signal conductor, e.g., from a via contact pad on a first PCB to a via contact pad on a second PCB. The length of each segment can be distributed across segments, e.g., a male connector segment and a female connector segment, that form the connector. In other words, the total length of the signal conductor may be a constraint on the individual signal conductors and the length of the respective conductors within each segment of a connector. As a further example, the width of a signal conductor in one segment may be constrained to equal the width of a signal conductor trace in another segment. For example, iteration processing constraints based on connector definition requirements stored in connector definition unit 604 can be constructed. For example, a minimum or a maximum trace width or trace spacing in a differential transmission pair may be constrained by manufacturing considerations. The constraints may be implemented using equations of constraint, Lagrange multipliers, and the like. Once the one or more simulation physical and/or performance constraints are constructed, operation of the process continues at S710.

At S710, connector signal conductor design controller 602 instructs simulation unit 610 to compute a constrained performance function using a set of parameter vectors assigned to the respective signal conductor segments. The constrained performance function may minimize an insertion loss, maximize a return loss, maximize a real power transfer coefficient, maximize a linear phase portion of a broadband signal that is transferred between the I/O cell and the terminal, maximize a Q function, minimize the integral of an insertion loss up to a pre-determined frequency, maximize a knee frequency, and the like. Constraints may be included in the calculation of the constrained performance function so that, for example, manufacturing requirements, and the requirement on the total length of the signal conductor are satisfied, as described at S708. Once computation of the constrained performance function has been initiated, operation of the process continues at S712.

It is noted that at S710, the performance function may include a norm of a difference between a trial transfer function of the signal conductor and a reference transmission or channel characteristic. For example, the trial transmission characteristic may be compared with a zero loss, linear-phase transfer characteristic, a Bessel function characteristic, and the like. The norm can be an absolute-value norm, a mean-square norm, a worst-case norm, and the like. In other words, the minimum insertion loss and maximum return loss may be simultaneously satisfied by a conservation of energy argument when using a mean-square norm. Alternatively, a worst-case norm can minimize a worst-case deviation of the signal conductor characteristic from an ideal characteristic, such as a zero loss, linear-phase characteristic, over a predefined bandwidth of a broadband signal.

At S712, optimizing unit 612 assesses the insertion loss, return loss or other parameter selected for optimization over the selected range of frequencies to determine if performance requirements defined in performance constraint unit 608 have been met. If so, the current set of segment vector parameters are stored to solution data store 614 in association with generated values for the generated insertion loss, return loss or other parameter selected for optimization. Further at S712, optimizing unit 612 compares the generated constrained performance result to previous results using a maximum-seeking or algorithm-stopping criterion. For example, the performance result may be compared with a previous performance function calculation to determine if an extreme has been reached, to determine if the gradient of the performance function is approximately zero, to determine if the performance function result exceeds a performance requirement, and the like. In one embodiment, optimizing unit 612 determines that a maximum has been achieved, the set of segment parameter vectors that generated the maximum are provided to connector signal conductor design controller 602 and operation of the process terminates at S712; otherwise, optimizing unit 612 selects a next set of segment vector parameters for use in the next constrained performance function by simulation unit 610, and operation of the process continues at S710.

Figure 8:
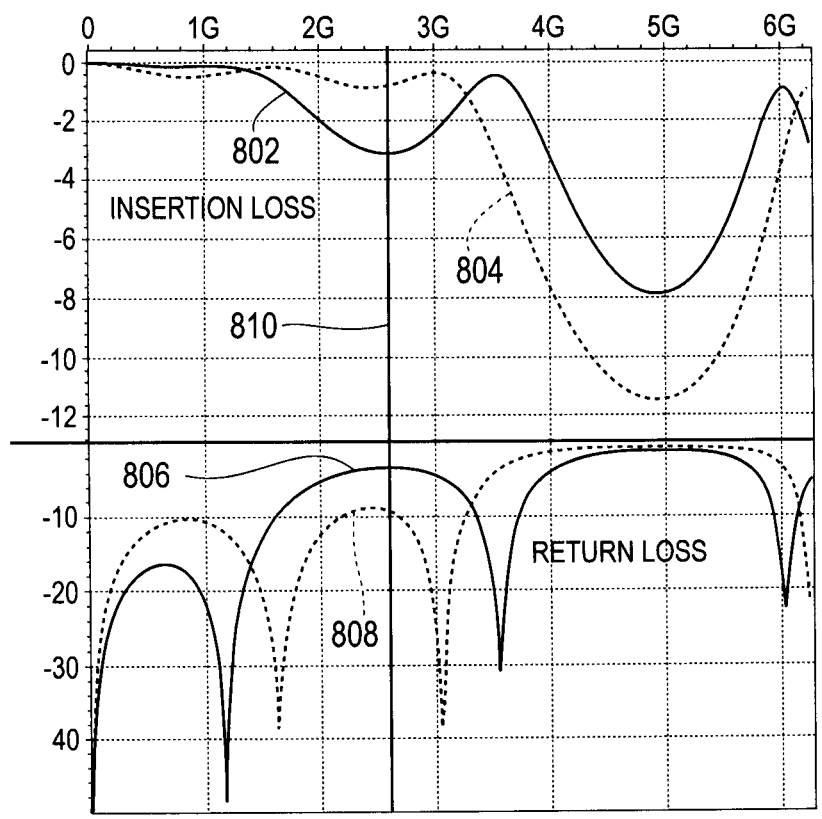
FIG. 8 shows an example of frequency domain plots that demonstrate improved signal transmission by a connector that compensates for via stub effects in accordance with an embodiment of the disclosure.

FIG. 8 shows an example of frequency domain plots that demonstrate improved signal transmission by a PCB connector signal conductor that compensates for via stub effects in accordance with an embodiment of the disclosure. Specifically, frequency domain plot 802 shows an unmodified insertion loss for a PCB connector signal conductor that is affected by the excess capacitance of via stubs at either end of the signal conductor. Frequency domain plot 804 shows a modified insertion loss for a PCB connector signal conductor in which the effects of excess via stub capacitance has been mitigated by adjusting the impedance of a middle segment of the PCB connector signal conductor, in accordance with the approach described above. Similarly, frequency domain plot 806 shows an unmodified return loss for a PCB connector signal conductor that is affected by the excess capacitance of via stubs at either end of the signal conductor. Frequency domain plot 808 shows a modified return loss for a PCB connector signal conductor in which the effects of excess via stub capacitance has been mitigated by adjusting the impedance of a middle segment of the PCB connector signal conductor, in accordance with the approach described above.

For example, as seen in FIG. 8, a cut-off frequency first appears in plot 802 at approximately 1.5 GHz, at which point the plot starts to drop, indicating an increase in insertion loss. This increase in insertion loss corresponds to reduced transmission of higher frequency signal components. For example, as seen in FIG. 8, transmission is degraded for signal components between 1.5 GHz and 3.4 GHz.

In contrast, frequency domain plot 804, shows a modified insertion loss for a PCB connector signal conductor in which the effects of excess via stub capacitance has been mitigated by adjusting, i.e., reducing, the impedance of a middle segment of the PCB connector signal conductor, in accordance with the approach described above. For example, as seen in FIG. 8 in plot 802, by decreasing the impedance of the signal conductor, the first cutoff frequency of the connector has been extended to approximately 3 GHz. As seen by a comparison of plot 806 and plot 808, the return loss has also decreases over the same 1.5 GHz and 3.4 GHz range.

For purposes of explanation in the above description, numerous specific details are set forth in order to provide a thorough understanding of the described connector that compensates for via stub effects and the described method of designing signal conductors used within the connector. It is noted, however, that the described embodiments may be practiced without these specific details. In other instances, various structures and devices are omitted from the figures, or are depicted in simplified block diagram form, in order to avoid obscuring the teaching features of the described embodiments.

While the connector that compensates for via stub effects and the method of designing signal conductors used within the connector have been described in conjunction with the specific embodiments thereof, it is evident that many alternatives, modifications, and variations will be apparent to those skilled in the art. Accordingly, the described embodiments, as set forth herein, are intended to be illustrative, not limiting. There are changes that may be made without departing from the spirit and scope of the invention.

What is claimed is:

1. A connector comprising:
a first signal conductor that is configured to receive a first electronic signal that includes multiple frequency components, the first signal conductor including a plurality of conductor portions characterized by portion-dependent impedances, the first signal conductor being configured to transfer the first electronic signal between a via on a first circuit board that has a via stub and a second circuit board that has a via stub to reduce via stub effects, wherein the first signal conductor further comprises:
a first longitudinal portion that has a first impedance;
a second longitudinal portion that has a second impedance that is different than the first impedance; and
a third longitudinal portion that has a third impedance that is different than the second impedance.

2. The connector of claim 1, wherein a first end of the first signal conductor is configured to connect to the via that has the via stub on the first circuit board.

3. The connector of claim 1, wherein the first signal conductor further comprises:
a ground return, electromagnetically coupled to the first longitudinal portion, the second longitudinal portion, and the third longitudinal portion.

4. The connector of claim 1, further comprising at least one of a male portion and a female portion.

5. The connector of claim 1, wherein a cross-sectional area of the second longitudinal portion is greater than a cross-sectional area of the first longitudinal portion and is greater than a cross-sectional area of the third longitudinal portion.

6. The connector of claim 1, wherein the third longitudinal portion of the first signal conductor is configured to have the same impedance as the first longitudinal portion.

7. The connector of claim 6, wherein the second longitudinal portion of the first signal conductor is configured to have a smaller impedance than the first longitudinal and the third longitudinal portions.

8. The connector of claim 1, further comprising:
a second signal conductor configured to transfer a second electronic signal, the first electronic signal and the second electronic signal being a pair of differential signals.

9. The connector of claim 8, wherein a distance between the first signal conductor and the second signal conductor varies for different portions.

10. The connector of claim 8, wherein the first signal conductor and the second signal conductor are configured with regard to each other to have portion-dependent differential impedances.

11. A method for reducing signal loss, the method comprising:
receiving from a via on a first circuit board a first electronic signal that includes multiple frequency components, wherein the via includes a via stub that causes an interference to transference of the first electronic signal over a first conductor extending between the via stub of the first circuit board and a via stub of a second circuit board; and
transferring the first electronic signal to the second circuit board through the first signal conductor that includes a plurality of portions having portion-dependent impedances to reduce the interference, wherein transferring includes:
passing the first electronic signal through a first longitudinal portion of the first signal conductor that has a first impedance;
passing the first electronic signal through a second longitudinal portion that has a second impedance that is different than the first impedance; and
passing the first electronic signal through a third longitudinal portion that has a third impedance that is different than the second impedance.

12. The method of claim 11, further comprising:
transferring a second electronic signal to the second circuit board through a second signal conductor, the first electronic signal and the second electronic signal being a pair of differential signals, the first signal conductor and the second signal conductor being configured with regard to each other to have portion-dependent differential impedances.

13. The method of claim 11, wherein transferring the first electronic signal to the second circuit board through the first signal conductor, further comprises:
transferring the first electronic signal to the second circuit board through the first signal conductor having the plurality of portions configured to mitigate capacitive discontinuity of the via stub.

14. The method of claim 11, wherein the first longitudinal portion, the second longitudinal portion, and the third longitudinal portion of the first signal conductor are electromagnetically coupled to a ground return.

15. The method of claim 11 wherein a cross-sectional area of the second longitudinal portion is greater than a cross-sectional area of the first longitudinal portion and is greater than a cross-sectional area of the third longitudinal portion.

16. The method of claim 11, wherein the third impedance is the same as the first impedance.

17. The method of claim 16, wherein the second impedance is less than the first impedance and the third impedance.

* * * * *